US010003310B1

(12) United States Patent
Masood et al.

(10) Patent No.: US 10,003,310 B1
(45) Date of Patent: Jun. 19, 2018

(54) SEGMENTED DIGITAL PREDISTORTION APPARATUS AND METHODS

(71) Applicant: NXP USA, Inc., Austin, TX (US)

(72) Inventors: Mir Adeel Masood, Mesa, AZ (US); Peter Zahariev Rashev, Calgary (CA); Jayakrishnan Cheriyath Mundarath, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/372,121

(22) Filed: Dec. 7, 2016

(51) Int. Cl.
*H04K 1/02* (2006.01)
*H03F 1/32* (2006.01)
*H03F 3/24* (2006.01)
*H03F 3/195* (2006.01)
*H04B 1/04* (2006.01)
*H04B 17/13* (2015.01)
*H04W 52/36* (2009.01)
*H04L 25/10* (2006.01)

(52) U.S. Cl.
CPC .......... *H03F 1/3247* (2013.01); *H03F 3/195* (2013.01); *H03F 3/245* (2013.01); *H04B 1/0475* (2013.01); *H04B 17/13* (2015.01); *H04L 25/10* (2013.01); *H04W 52/362* (2013.01); *H03F 2200/321* (2013.01); *H04B 2001/0425* (2013.01)

(58) Field of Classification Search
CPC ........ H03F 1/3247; H03F 3/24; H03F 1/3241; H03F 1/3294; H03F 2201/3233; H04L 27/368; H04L 25/03343; H04L 1/0003; H04L 1/0071; H04L 5/0007; H04L 1/0009; H04L 27/0008; H03G 3/3042

USPC ................. 375/297, 296, 295, 219
See application file for complete search history.

(56) References Cited

U.S. PATENT DOCUMENTS

| | | | |
|---|---|---|---|
| 8,369,447 | B2 | 2/2013 | Fuller et al. |
| 8,952,758 | B2 | 2/2015 | Embar et al. |
| 9,130,628 | B1 | 9/2015 | Mittal et al. |
| 9,219,540 | B2 | 12/2015 | Vu et al. |
| 9,231,530 | B1 | 1/2016 | Kaushik et al. |
| 9,252,821 | B2 | 2/2016 | Shor et al. |

(Continued)

OTHER PUBLICATIONS

Moon, J. et al. "Wideband Digital Feedback Predistortion Employing Segmented Memory Compensation for Linearization of Doherty Amplifier", Proceedings of the 40th Eur. Microw. Conf., pp. 727-730 (Sep. 2010).

*Primary Examiner* — Zewdu Kassa
(74) *Attorney, Agent, or Firm* — Sherry W. Schumm

(57) ABSTRACT

In an RF transmitter, a digital predistortion circuit receives a sequence of input sample blocks, and performs a digital predistortion process to produce a predistorted output signal. The digital predistortion process includes selecting a set of predistortion coefficients for an input sample block from a plurality of different sets of predistortion coefficients. Each of the plurality of different sets of predistortion coefficients is associated with a different combination of one of a plurality of time slices within a radio frame and one of a plurality of power ranges. The selected set of predistortion coefficients is associated with a time slice within which the input sample block is positioned and a power range calculated for the input sample block based on block power statistics of the sample block. The process also includes applying the selected set of predistortion coefficients to the input sample block to produce the predistorted output signal.

19 Claims, 5 Drawing Sheets

(56) References Cited

U.S. PATENT DOCUMENTS

| | | |
|---|---|---|
| 9,325,357 B2 | 4/2016 | Volokhine et al. |
| 2004/0142667 A1 | 7/2004 | Lochhead et al. |
| 2005/0099230 A1 | 5/2005 | Shanbhag |
| 2007/0103140 A1* | 5/2007 | Bernard .............. G01R 23/16 324/76.21 |
| 2009/0302940 A1* | 12/2009 | Fuller ................ H03F 1/3247 330/149 |
| 2012/0154041 A1* | 6/2012 | Kim .................. H03F 1/3247 330/149 |
| 2014/0169426 A1 | 6/2014 | Aziz et al. |
| 2014/0333377 A1 | 11/2014 | Peroulas et al. |
| 2015/0381220 A1* | 12/2015 | Gal .................. H04B 1/0475 375/296 |
| 2017/0244582 A1* | 8/2017 | Gal ................ H04L 25/03885 |

\* cited by examiner

SEGMENTED DIGITAL PREDISTORTION APPARATUS AND METHODS

TECHNICAL FIELD

Embodiments of the subject matter described herein relate generally to apparatus and methods for performing digital predistortion for a power amplifier.

BACKGROUND

In the cellular communications market, the demand for high data rate communications continues to grow, and this growth is coupled with an exponential increase in wireless subscribers. These trends have led to the development and widespread use of spectrally efficient, complex modulation protocols for use with signals that have high peak to average power ratios (PAPR) and wide signal bandwidth. These complex modulation protocols, which are implemented in a transmitter lineup, pose significant challenges to conventional techniques for linearizing downstream radio frequency (RF) power amplifier operation.

Digital predistortion (DPD) techniques are commonly implemented to improve power amplifier linearization. More specifically, implementation of a DPD technique in a transmitter lineup may result in significant improvements to power amplifier efficiency by enabling the amplifier to be operated at a less significant backoff point from its saturation point, while meeting required linearity conditions (e.g., spectrum emission mask (SEM) and adjacent channel power (ACP) specifications).

However, the performance of conventional DPD techniques suffers significant degradation when used with complex modulation schemes that are characterized by high PAPR and wide signal bandwidth. The performance challenges increase when the RF power amplifier is being operated under dynamic conditions (e.g., when the amplifier is operating in an ETM2 (Enhanced Test Mode 2)) or 3G LTE-TDD (Long Term Evolution Time-Division Duplex) mode. Accordingly, developers continue to search for DPD apparatus and methods that result in improved power amplifier linearization even when used in conjunction with complex modulation schemes developed for signals with high PAPR and wide signal bandwidth.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
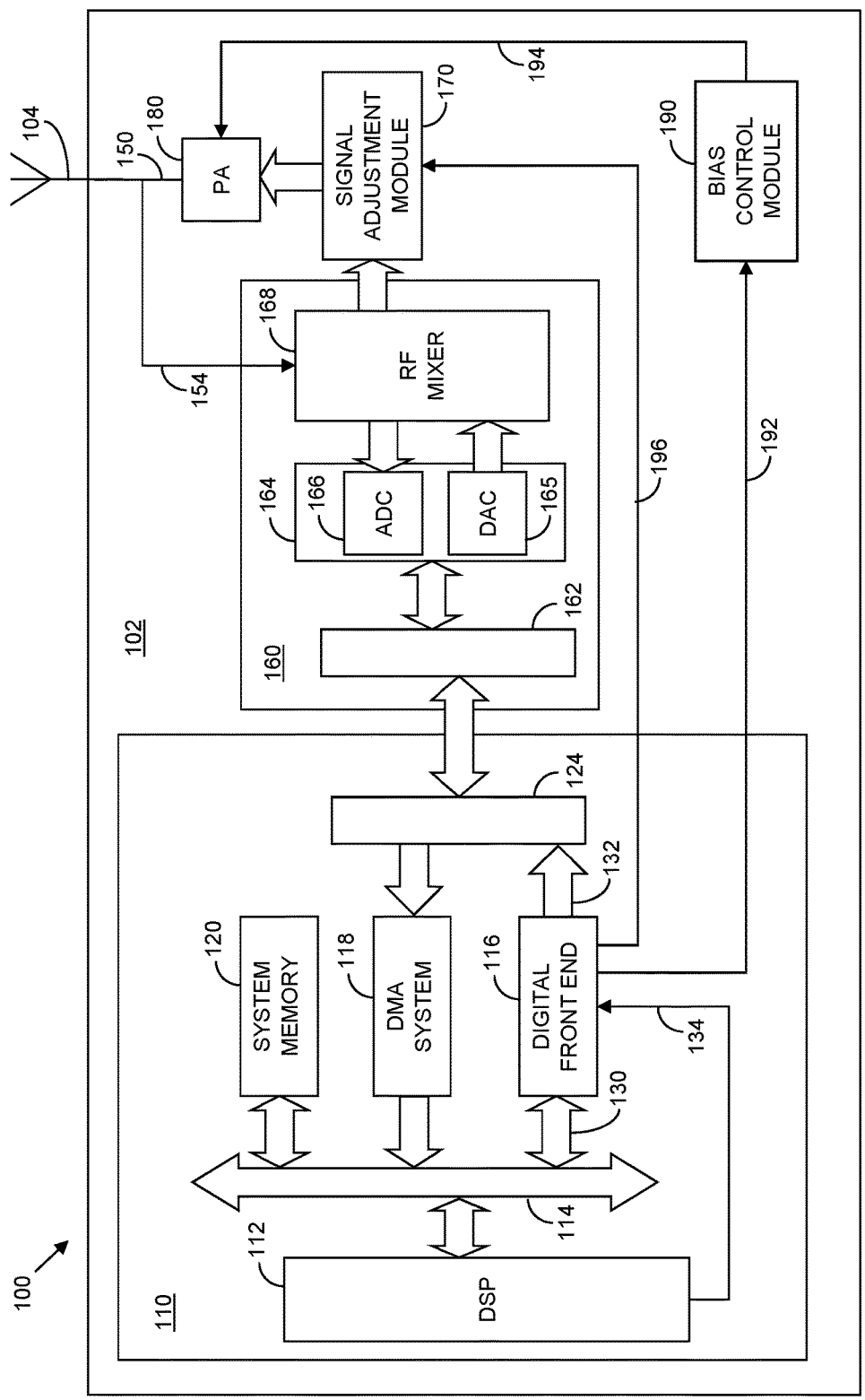
FIG. 1 is a portion of an RF transceiver system that includes an RF transmitter coupled to an antenna for transmitting one or more modulated carrier wave signals, in accordance with an example embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Using nomenclature associated with Global System for Mobile (GSM) standards of wireless communication (e.g., third generation (3G) and fourth generation (4G) standards), a cellular communication system includes a mobile switching center (MSC), home location registers (HLR), base station controllers (BSC), base transceiver stations (BTS), and user equipment (UE) (e.g., cellular telephones and other cellular devices). A BTS facilitates communication between the UEs and an MSC over a cellular network. For example, a BTS in the GSM standard corresponds to a 3G "Node-B" and a 4G "enhanced" Node-B or "eNode-B". A Node-B uses UTRA protocols WCDMA (Wideband Code Division Multiple Access) or TD-SCDMA on its radio interface, whereas an eNode-B uses the E-UTRA protocols OFDMA (downlink) and SC-FDMA (uplink) on its LTE-radio interface. The description herein uses Orthogonal Frequency Division Multiple Access (OFDMA) as an example of a digital modulation technique implemented by the BTS. Those of skill in the art would understand, based on the description herein, how to apply the various embodiments to other modulation techniques, as well.

To maintain synchronization, each protocol defines a specific frame (and subframe) structure for the communications between the BTS and UEs. For example, LTE systems may have different frame structures depending on whether the system is being operated in a Frequency Division Duplex (FDD) or a Time Division Duplex (TDD) mode. In an LTE TDD mode, for example, each frame may be defined to have a frame width (or duration) of 10 milliseconds (ms), which comprises ten subframes that each are 1 ms wide. Subframes may be special subframes or standard subframes, for example. Special subframes may be used to convey downlink (BTS-to-UE) and uplink (UE-to-BTS) pilot signals, for example. In a TDD mode, standard subframes may be used to carry either downlink or uplink signals, depending on whether the BTS transceiver is in transmit or receive mode. An LTE TDD standard may define a number of uplink-downlink configurations, for example, where each configuration specifies which subframes are allocated for downlink signals, which subframes are allocated for uplink signals, and which subframes are special subframes. In a BTS, a frame/slot reference pulse within a synchronization signal may indicate the start of each frame.

Essentially, a BTS includes an RF transceiver with a transmitter configured to transmit RF signals to the UEs, and a receiver configured to receive RF signals from the UEs. In the BTS, the RF transmitter modulates a carrier wave by changing one or more characteristics of the carrier wave (e.g., amplitude, frequency, and/or phase) based on information contained within a baseband signal. The RF transmitter includes a power amplifier, which amplifies the modulated carrier wave signal. An antenna is used to transmit the amplified signal to the UEs over a transmission medium (e.g., an air interface).

Digital predistortion (DPD) techniques are commonly implemented to improve power amplifier linearization in a BTS transmitter. Embodiments of the subject matter described herein include DPD apparatus and methods that may be implemented in a BTS transmitter, or in an analogous subsystem in a cellular system other than a GSM 3G or 4G type of system. For example purposes, the nomenclature used herein is consistent with GSM 3G and 4G systems. However, those of skill in the art would understand, based on the description herein, how to adapt the various embodiments to systems that implement other technologies. Accordingly, such adaptations are intended to fall within the scope of the inventive subject matter.

As will be described in more detail below, in conjunction with embodiments of DPD apparatus and methods, an RF transmitter is configured to classify received input sample blocks based on sample block timing (within a radio frame) and dynamic range. As used herein, an "input sample block" includes a number of consecutive digital samples, where the samples in any given block comprise a time-domain representation of a portion of a composite signal that includes one or more of carriers multiplexed in within the transmission frequency band, where each carrier belongs to a specific radio access technology (RAT) (e.g., including but not limited to LTE with differing bandwidths, WCDMA, GSM, and so on). For example, each carrier may belong to a specific RAT selected from Long Term Evolution (LTE) with differing bandwidths, Wideband Code Division Multiple Access (WCDMA), and Global System for Mobile communication (GSM). In one embodiment, for example, the sequence of input sample blocks may include a sequence of samples of time-domain representations of one or more symbols (e.g., one or more Orthogonal Frequency Division Multiplexing (OFDM) symbols or other types of symbols). According to an embodiment, a radio frame is divided into a plurality of consecutive time ranges (or "time slice segments"), and a power range of interest is divided into a plurality of consecutive power sub-ranges (or "dynamic range segments"). Each sample block is evaluated to classify the sample block as falling within a particular one of the plurality of time slice segments, and as falling within a particular one of the dynamic range segments. Although dynamic range may be one power-related quantity that may be used for power-based segmentation, other power-related quantities may be used in other embodiments (e.g., peak power, average power, RMS power, crest factor, and so on).

As will be explained in detail below, potentially different DPD model selections (e.g., predistortion coefficients) may be associated with each combination of time slice and dynamic range segments. Accordingly, if a radio frame is divided into $N_{TS}$ time slice segments, and a power range of interest is divided into $N_{DR}$ dynamic range segments, there are $N_{TS} \times N_{DR}$ different time slice/dynamic range segment combinations, and $N_{TS} \times N_{DR}$ potentially different DPD model selections. According to an embodiment, each of the $N_{TS}$ time slice segments are divided into the same number, $N_{DR}$, of dynamic range segments. In alternate embodiments, the power range of interest for the various time slice segments may differ, and/or the power range of interest for different time slice segments may be divided into different numbers of dynamic range segments. According to an embodiment, a DPD model selection is made for each input sample block based on the classification of the input sample block as falling within a particular time slice segment and a particular dynamic range segment. The selected DPD model is applied to the input sample block to perform digital predistortion of the sample block before digital-to-analog conversion and amplification.

Implementation of the various embodiments may result in significant improvements to DPD performance, when compared with conventional DPD techniques, even when complex modulation schemes are used for signals that are characterized by high PAPR and wide signal bandwidth. The DPD performance improvements are reflected by improvements to the power amplifier linearization given reduced backoff levels. Further, the various embodiments are suitable for use with power amplifiers that are being operated under dynamic conditions (e.g., when the amplifier is operating in LTE-TDD mode or ETM2, among other modes). The various embodiments also may be implemented in systems that include power amplifiers with various types of architectures (e.g., class-AB amplifiers, class-B amplifiers, class-C amplifiers, symmetric/asymmetric Doherty amplifiers, switched mode power amplifiers, and so on), and amplifiers that include various types of power transistors (e.g., laterally diffused metal oxide semiconductor (LDMOS) transistors, heterojunction bipolar transistors (HBTs), gallium nitride transistors (GaN), and so on).

FIG. 1 illustrates a portion of an RF transceiver system 100 that includes an RF transmitter 102 coupled to an antenna 104 for transmitting one or more modulated carrier wave signals, in accordance with an example embodiment. The RF transmitter 102 includes a baseband processing unit 110, an RF conversion circuit 160, and a power amplifier (PA) 180. The baseband processing unit 110 includes a digital signal processor (DSP) 112, a system bus 114, a digital front end module 116, a direct memory access system (DMA) 118, system memory 120, and an interface 124. The RF conversion circuit 160 includes an interface 162, a data converter 164, and an RF mixer 168. The data converter 164 includes a digital-to-analog converter (DAC) 165 and an analog-to-digital converter (ADC) 166.

The DSP 112 performs logical and mathematical operations on digital data (e.g., audio and video data) in order to generate one or more streams of baseband digital samples. According to an embodiment, the DSP 112 may generate a stream of baseband digital samples for each sub-carrier frequency onto which the data is modulated, and each stream may have a different sample rate. For example, each stream of baseband digital samples may include time-domain representations of a series of information-containing symbols associated with the particular cellular standard being implemented by the RF transmitter 102 (e.g., OFDM symbols). The DSP 112 also assembles each stream of samples into data frames that are formatted according to the implemented cellular standard and, in some cases, a selected mode defined by the standard.

The DSP 112 is coupled to the digital front end module 116, the DMA 118, and the system memory 120 via the system bus 114. The DSP 112 provides the data frames as digital input signals 130 to the digital front end module 116, where each input signal 130 represents a stream of baseband digital samples at a given sample rate. In addition, the DSP 112 may produce synchronization signals 134 that include frame/slot reference pulses, where the frame/slot reference pulses indicate the timing for the beginning of each frame (and/or subframe) of input samples. In other embodiments, the synchronization signals 134 may originate from another system component.

The digital front end module 116 receives the input signals 130, performs digital upconversion (DUC) and crest factor reduction (CFR), and afterwards generates a predistorted output signal 132 based on a digital feedback signal 154, discussed later. According to an embodiment, the predistortion process includes combining (e.g., multiplying) a processed representation of the input signals 130 with various sets of "predistortion coefficients" that are stored in the digital front end module 116 or otherwise accessible to the digital front end module 116. According to a more specific embodiment, a plurality of different sets of predistortion coefficients are stored in a table, which is accessible to the digital front end module 116. Each set of predistortion coefficients is indexed in the table based on a temporal location (e.g., within a frame) of a block of input samples being predistorted, and based on a dynamic range of the block of input samples. Various types of digital predistortion models may be applied to the input sample blocks, and a selected set of predistortion coefficients for the model affects how the predistorted output signals are generated. In other words, different sets of predistortion coefficients may be applied to blocks of input samples based on the temporal location of the sample block in a radio frame and also based on the dynamic range of the sample block.

In an embodiment, the digital predistortion model may be a lookup tables (LUT) based model. In another example embodiment, the digital front end module 116 uses a memory polynomial (MP) based DPD model, a generalized MP DPD model, a pruned Volterra DPD model, or another suitable DPD model in the digital predistortion process. In such an embodiment, the digital front end module 116 includes a parameter extraction unit (not shown), that receives a digital feedback signal (e.g., based on analog feedback signal 154) and updates the predistortion coefficients based on a Volterra model. The pruned Volterra model is particularly well suited to model the non-linearity of PAs with memory effects. In still other embodiments, the digital front end module 116 may use other types of digital predistortion models, including but not limited to generalized memory polynomials and other types of models.

The DMA 118 and the digital front end module 116 are coupled to the data converter 164 through the interfaces 124 and 162. Interface 124 (e.g., JESD) receives the predistorted output signal 132 from the digital front end module 116, and transfers the predistorted output signals to the interface 162 within the RF conversion circuit 160. Within the RF conversion circuit 160, the DAC 165 receives the predistorted output signals from the interface 162, and generates analog baseband signals by performing a digital-to-analog conversion on the received digital signals. The RF mixer 168 coupled to the DAC 165 receives the analog baseband signals, and upconverts the baseband signals to generate analog RF signals at appropriate carrier frequencies.

According to an embodiment, the RF transmitter 102 may include a signal adjustment module 170 coupled between the RF mixer 168 and the PA 180. The signal adjustment module 170 may include a signal splitter that divides the upconverted RF signal from the RF mixer 168 into two or more RF signals, depending on the architecture of the PA 180. For example, when the PA 180 includes two or more parallel amplification paths (e.g., when the PA 180 is implemented as a multi-way Doherty amplifier with a carrier amplifier path and one or more peaking amplifier paths), the signal splitter of the signal adjustment module 170 may divide the upconverted RF signal from the RF mixer 168 into two or more upconverted RF signals for provision to the two or more amplification paths. In addition, the signal adjustment module 170 may include a signal adjustment circuit for each amplification path. For example, each signal adjustment circuit may include a fixed or variable attenuator and/or a fixed or variable phase shifter. Accordingly, based on control signals 196 from the digital front end module 116, each signal adjustment circuit may impart fixed or variable attenuations and/or phase shifts to each upconverted RF signal before provision of each RF signal to the PA 180. Essentially, the signal adjustment module 170 may control the differential phase and gain relationship amongst the RF signals being provided to the multiple amplification paths of the PA 180.

In a further embodiment, the signal adjustment module 170 may be configured to perform dynamic switching as a function of the signal envelope. In such an embodiment, signal transients associated with the dynamic switching may be modeled and corrected for within the various time slice segments over the signal dynamic range, in a further embodiment. In an alternate embodiment, the signal adjustment module 170 may be excluded from the RF transmitter 102.

The PA 180, which is coupled to the RF mixer 168 (or to the signal adjustment module 170, if included), receives and amplifies the analog RF signal(s) to produce an amplified RF signal 150. In various embodiments, the PA 180 may have any of a variety of amplifier architectures, including but not limited to class-AB amplifiers, class-B amplifiers, class-C amplifiers, symmetric/asymmetric Doherty amplifiers, switched mode power amplifiers, or other amplifier architectures. When the PA 180 includes a Doherty amplifier with a carrier amplifier path and one or more peaking amplifier paths, and when the signal adjustment module 170 is included in the system 100, the aforementioned signal splitter of the signal adjustment module 170 may be used as the signal splitter of the Doherty amplifier, as would be understood by those of skill in the art based on the description herein. In an embodiment that includes multiple antennas 104 (e.g., a multiple-in, multiple-out (MIMO) or other multi-antenna system), multiple PAs 180 may be implemented, where each of the multiple PAs amplifies a corresponding RF signal and provides the amplified RF signal 150 to one of the multiple antennas 104.

According to yet another embodiment, the RF transmitter 102 may include a bias control module 190 coupled to the digital front end 116 and to the PA 180. Based on control signals 192 received from the digital front end module 116, the bias control module 190 may perform dynamic gate bias modulation and/or drain bias modulation, through bias signals 194, for the power amplifier transistors within the PA 180. The gate and/or drain bias modulation may be characterized as fast (e.g., envelope-based modulation) or slow (e.g., signal root mean square (rms) power-based modulation), in various embodiments. Due to the dynamic nature of the operation of the bias control module 190, it also may benefit from the time and dynamic range segmentation methods described herein in terms of potentially enhancing the efficiency of the gate and/or drain bias modulation. In an alternate embodiment, the bias control module 190 may be excluded from the RF transmitter 102.

According to an embodiment, the RF mixer 168 also may receive, as a feedback signal 154, a representation of the amplified RF signal 150 from the output of the PA 180. The RF mixer 168 downconverts the feedback signal 154 to generate a baseband analog feedback signal. The ADC 166 receives the baseband analog feedback signal and performs an analog-to-digital conversion to generate a baseband digital feedback signal. The DMA system 118 receives digital data corresponding to the baseband digital feedback signal by way of interfaces 162 and 124, and may store the baseband digital feedback signal in the system memory 120 or provide them to the DSP 112 or digital front end module 116.

The digital front end module 116 accesses the baseband digital feedback signal, and compares it with a time-aligned (e.g., delayed) version of the predistorted output signal 132 previously produced by the digital front end module 116. The comparison indicates the magnitude of non-linearity applied to the RF signal by the PA 180. Based on the magnitude of the non-linearity, the digital front end module 116 may perform an adaptive process in which the stored predistortion coefficients are updated to reduce the non-linearity of signal 150 produced by the PA 180.

Thus, to enhance linearity of the PA(s) 180, the digital front end module 116 performs a digital predistortion process, as indicated above. Essentially, the predistortion process includes the digital front end module 116 performing a mathematical inversion of the non-linearities in RF feedback signal 154 received from the PA 180 representing non-linear characteristics of the PA. To accomplish this, the predistortion coefficients are generated to have inverse characteristics of the digital feedback signal 154. Thus, when the digital front end module 116 applies the predistortion coefficients to input signals 130 that are provided to the digital front end 116, the predistorted output signal 132, once amplified by the non-linear PA 180, should yield a more linear amplified RF signal 150. In other words, the digital predistortion process may enable the PA 180 to generate a more linear amplified analog RF signal 150.

Figure 2:
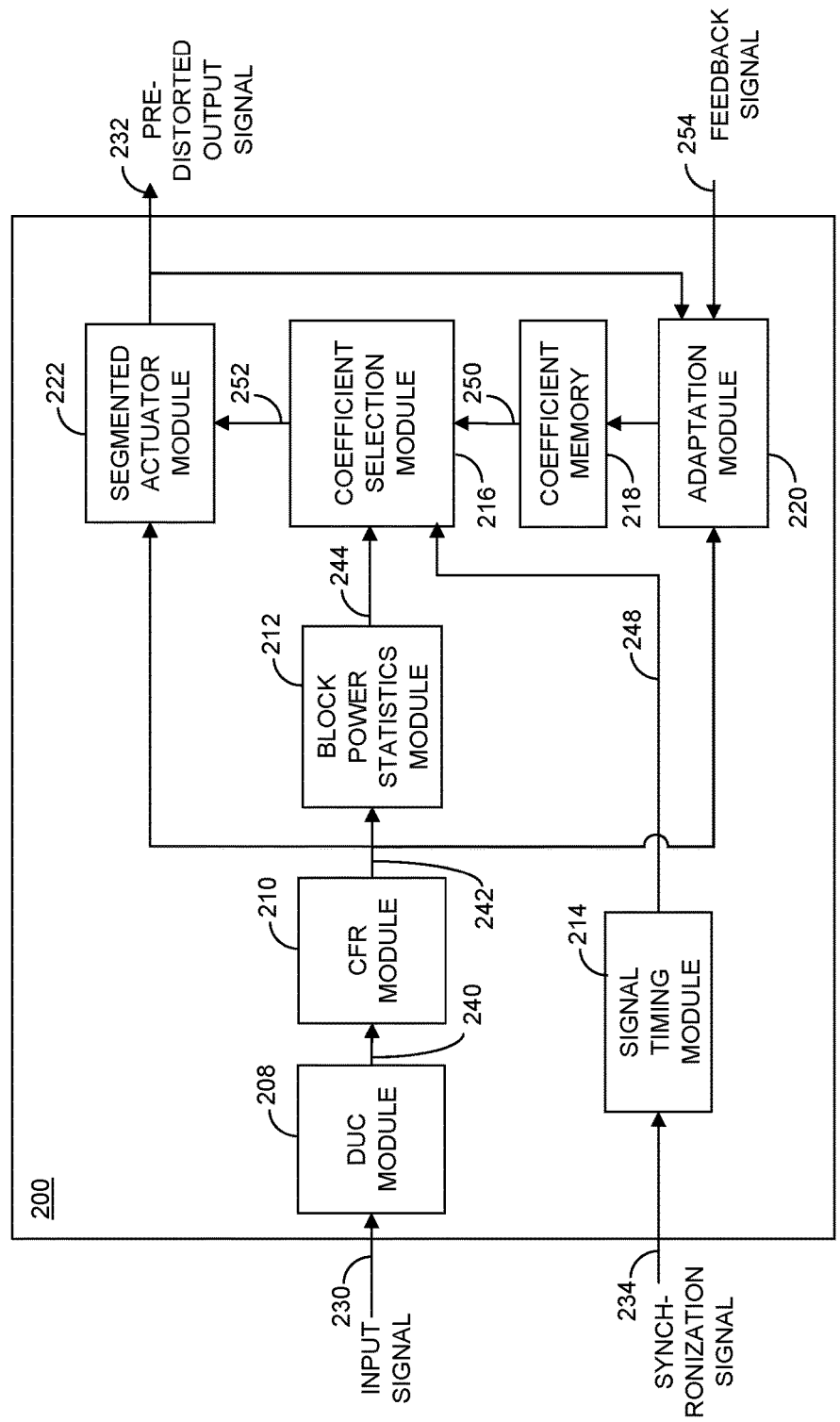
FIG. 2 is a digital front end for a transmitter incorporating DPD, in accordance with an example embodiment.

FIG. 2 is an example of a portion of a digital front end module 200 (e.g., module 116, FIG. 1) for a transmitter (e.g., transmitter 102, FIG. 1) configured to implement digital predistortion, in accordance with an example embodiment. During the description of operation of the digital front end module 200, reference may be made to steps of the process depicted in FIG. 5, which is a flowchart of a method for performing segmented digital predistortion on an input signal, in accordance with an example embodiment.

In an embodiment, digital front end module 200 is implemented on a single integrated circuit, although it may be implemented using multiple integrated circuits, in other embodiments. For example, digital front end module 200 may be implemented as a portion of a vector signal processor, in an embodiment. Digital front end module 200 includes digital up conversion (DUC) module 208, crest factor reduction (CFR) module 210, block power statistics module 212, signal timing module 214, coefficient selection module 216, coefficient memory 218, adaptation module 220, and segmented actuator module 222, in an embodiment.

The DUC module 208 receives and up-samples one or more baseband input signal(s) 230 (e.g., input signal 130, FIG. 1), and provides an up-sampled aggregated signal 240 combining one or more channels having a given sample rate. In an embodiment configured for single carrier modulation, the DUC module 208 receives a single baseband input signal 230, utilizes an up-sampling element (not illustrated) to potentially up-sample the input signal 230, and utilizes a mixer (not illustrated) to mix the up-sampled signal with a complex sinusoid corresponding to the single carrier frequency. This results in up-sampled RF signal 240, which is provided to CFR module 210. In an embodiment configured for multi-carrier modulation (e.g., OFDMA), the DUC module 208 may receive N baseband input signals 230, where N is the number of carriers that are modulated to convey the input signals 230. In such an embodiment, the DUC module 208 utilizes N up-sampling elements (not illustrated), each configured to potentially up-sample one of the input signals 230, and N mixers (not illustrated), and each configured to mix one of the up-sampled signals with a complex sinusoid corresponding to the one of the carrier frequencies. The outputs of the N mixers are provided to a combining element (not illustrated), which combines the signals received from the mixers, and provides a composite RF signal 240 to an input of CFR module 210.

CFR module 210 receives the upconverted signal 240 from DUC module 208, and performs a crest factor reduction process to produce a crest factor reduced signal 242, in the form of a sequence of sample blocks, with a potentially reduced crest factor. The crest factor reduced signal 242 produced by CFR module 210 is provided to block power statistics module 212 and to segmented actuator module 222, in an embodiment.

Embodiments of segmented digital predistortion are performed or enabled primarily by block power statistics module 212, signal timing module 214, coefficient selection module 216, and segmented actuator module 222. Block power statistics module 212 receives the crest factor reduced signal 242, and calculates one or more block power statistics for each sample block (block 502, FIG. 5). As used herein, "block power statistics" means one or more values for a sample block that indicate one or more quantifications of the signal power of the sample block. For example, according to various embodiments, block power statistics may include one or more values for a sample block that are selected from a peak power value, an average power value, a dynamic range value, a root mean squared (RMS) value, and a crest factor, although block power statistics may include other power-indicating values, as well. The block power statistics module 212 provides one or more signals 244 indicating the calculated block power statistics to the coefficient selection module 216.

In addition to receiving the block power statistics signal(s) 244, the coefficient selection module 216 receives a timing signal 248 from the signal timing module 214. According to an embodiment, the signal timing module 214 receives a synchronization signal 234 (e.g., synchronization signal 134, FIG. 1), which indicates the timing for the beginning of each frame (and/or subframe) of input samples. This signal may be referred to, for example, as a frame pulse. From the synchronization signal 234, the signal timing module 214 may determine the timing of each sample block (e.g., the temporal location of each sample block within the radio frame), and may produce the timing signal 248 to indicate the beginning, end, and/or duration of each sample block. Alternatively, the signal timing module 214 may simply convey the frame pulse to the coefficient selection module 216, or may convey some other timing information that enables the coefficient selection module 216 to synchronize the block power statistics information with particular sample blocks. According to an embodiment, the system 200 is configured to synchronize the timing signal 234 and the block power statistics signal 244. In other words, the coefficient selection module 216 is capable of correlating the block power statistics conveyed in signal 244 with the timing information conveyed in timing signal 248 so that particular block power statistics may be associated with a particular sample block.

Figure 5:
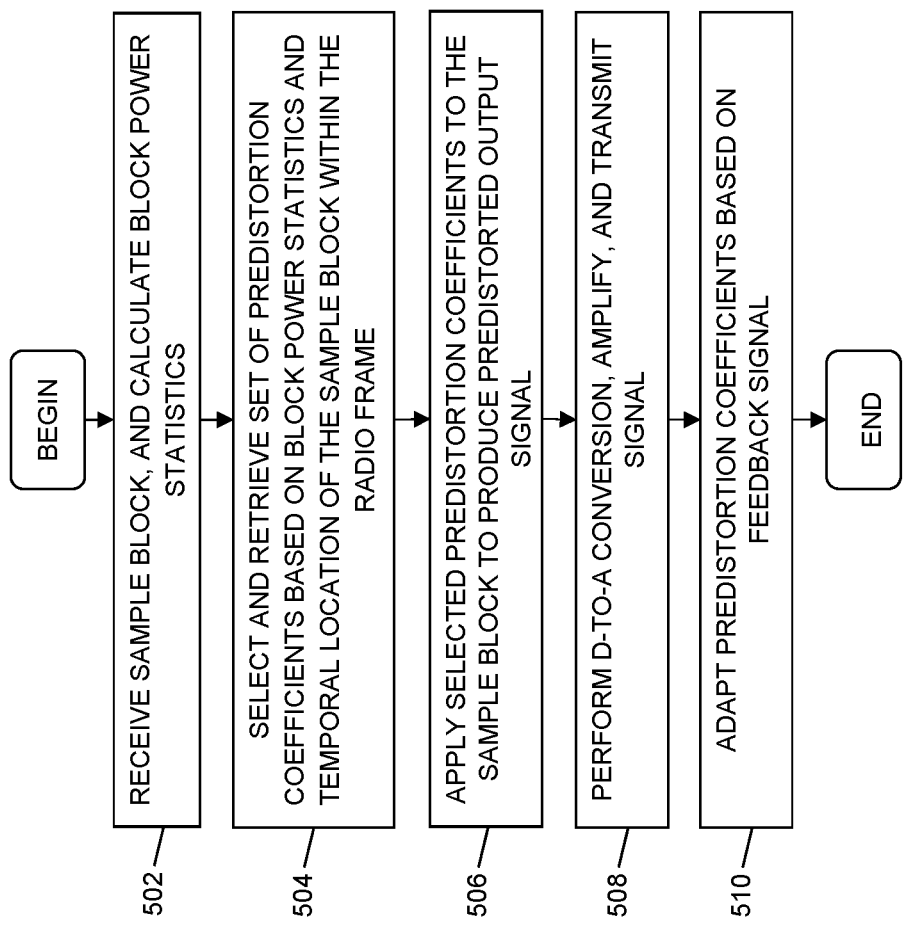
FIG. 5 is a flowchart of a method for performing segmented DPD on an input signal, in accordance with an example embodiment.

The coefficient selection module 216 is configured to select a set of predistortion coefficients based on the block power statistics (conveyed in the block power statistics signal 244) and the temporal location of the block within a frame (conveyed in the timing signal 234) (block 504, FIG. 5). As mentioned previously and as will be discussed in more detail below, a radio frame is divided into a plurality of consecutive time ranges (or "time slice segments"), and a power range of interest is divided into a plurality of consecutive power sub-ranges (or "dynamic range segments"), in an embodiment. Based on the received block power statistics 244 and timing signal 248, the coefficient selection module 216 evaluates each sample block to classify the sample block as falling within a particular one of the plurality of time slice segments, and as falling within a particular one of the dynamic range segments. The coefficient selection module 216 is configured to select a DPD model (e.g., a set of predistortion coefficients) for each input sample block based on the classification of the input sample block as falling within a particular time slice segment and a particular dynamic range segment. For example, and as also mentioned previously, if a radio frame is divided into $N_{TS}$ time slice segments, and a power range of interest is divided into $N_{DR}$ dynamic range segments, there are $N_{TS} \times N_{DR}$ different time slice/dynamic range segment combinations, and $N_{TS} \times N_{DR}$ potentially different DPD model selections.

For example, the duration of a radio frame may be segmented into $N_{TS}$ time slice segments with thresholds $T_1$, $T_2, \ldots, T_{NTS}$, where $0 < T_1 < \ldots < T_{NTS}$ (which repeats at each start of frame). In addition, a total power range of interest (e.g., normalized to an input signal level) may be segmented into $N_{DR}$ dynamic range segments with thresholds $V_1$, $V_2, \ldots, V_{NDR}$, where $0 < V_1 < V_2 < \ldots < V_{NDR}$. In other words, a total normalized dynamic range between 0 and $V_{NDR}$ is segmented into $N_{DR}$ dynamic range segments. In such an example, the input signal blocks for one radio frame of an input signal, S, may be represented as:

$$S = \sum_{t=1}^{N_{TS}} \sum_{v=1}^{N_{DR}} S_{t,v} = \sum_{t=1}^{N_{TS}} (S_{t,0} + S_{t,1} + \ldots + S_{t,N_{DR}})$$

As mentioned previously, each of the $N_{TS}$ time slice segments may be divided into the same number, $N_{DR}$, of dynamic range segments. In alternate embodiments, the power range of interest for the various time slice segments may differ, and/or the power range of interest for different time slice segments may be divided into different numbers of dynamic range segments. Those of skill in the art would understand, based on the description herein, how to adapt the embodiments discussed herein in more detail to account for such alternate embodiments.

Figure 3:
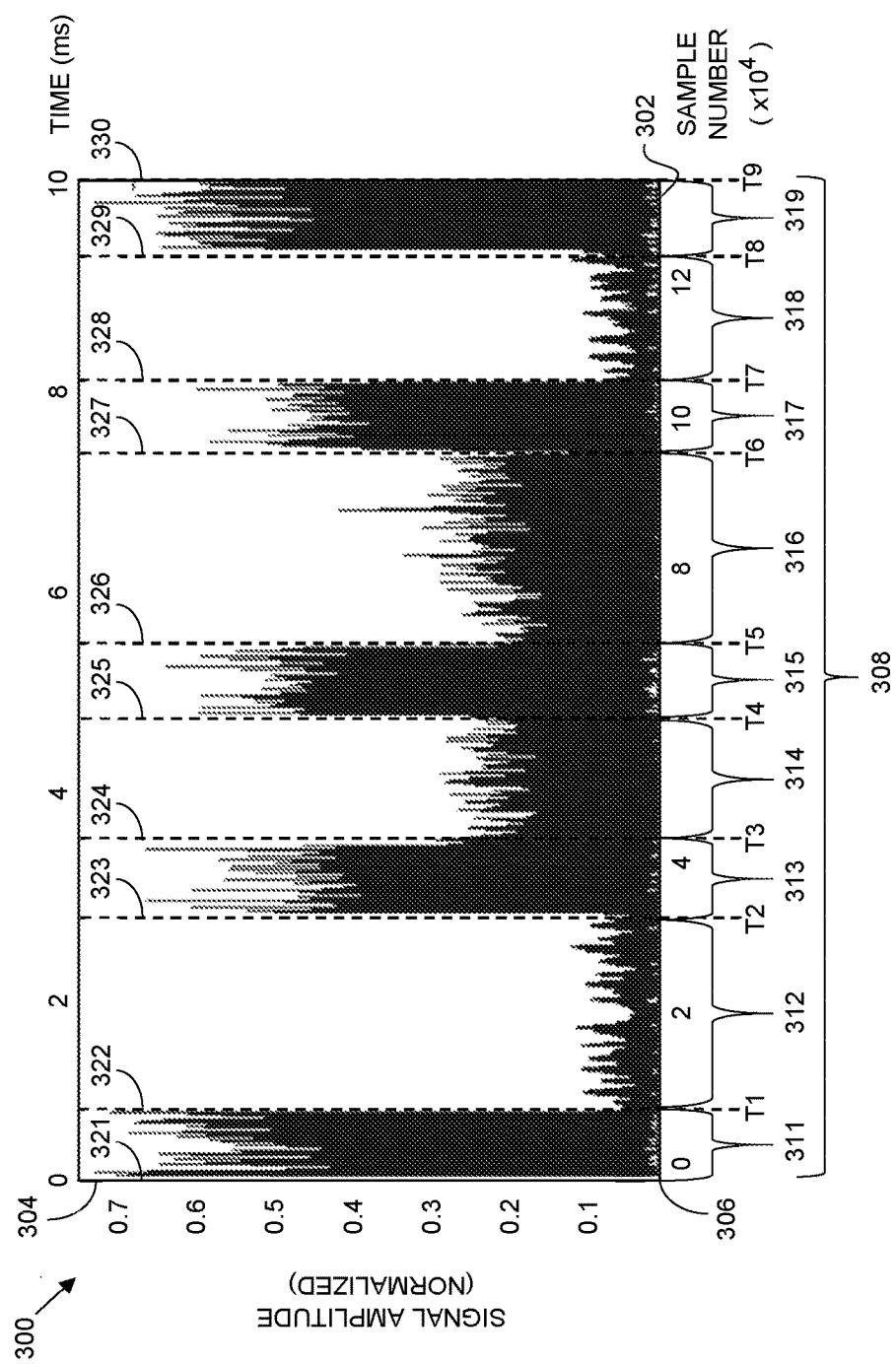
FIG. 3 illustrates a time versus amplitude plot for an example input signal with indications of time slice boundaries, in accordance with an example embodiment.

To more clearly illustrate the time-segmentation aspect of the DPD embodiments, FIG. 3 illustrates a time versus amplitude plot 300 for an example input signal with indications of time slice boundaries, in accordance with an example embodiment. More specifically, plot 300 is a time-domain representation of signal power over the duration of a frame, where the x-axis 302 corresponds to time (or sample number), and the y-axis 304 corresponds to signal amplitude (e.g., normalized absolute value or in decibels (dB)). With respect to the time axis 302, the origin 306 may correspond to the beginning of a frame (e.g., a first sample), where the frame has a total duration 308 (e.g., measured in terms of number of samples or time). For example, a frame may have a duration of about 10 milliseconds (ms), and may include about 2,457,600 samples at 245.76 MSPS sampling rate, although a frame may have more or fewer samples depending on the carrier type, sampling rate, and/or a frame may have a longer or shorter duration, as well. With respect to the amplitude axis 304, the origin 306 may correspond to a lowest amplitude threshold at or near the noise floor for the signal (e.g., −25 dB). In the embodiment illustrated in FIG. 3, the duration 308 of the frame is segmented into multiple (i.e., $N_{TS}$=9) time slice segments 311, 312, 313, 314, 315, 316, 317, 318, 319. Although the embodiment of FIG. 3 depicts segmentation into 9 time slice segments 311-319, a radio frame may be segmented into more or fewer segments, as well. Each segment boundary 322-330 corresponds to a time slice threshold $T_1$, $T_2$, . . . , $T_9$. For example, segment 311 is bounded by segment boundaries 321 and 322. When a signal block is offset from the frame pulse by an amount of time between 0 and threshold T1(corresponding to boundary 322), the signal block would be associated with time slice segment 311. Similarly, when a signal block is offset from the frame pulse by an amount of time between thresholds T8 and T9 (corresponding to boundaries 329 and 330), the signal block would be associated with time slice segment 319.

According to an embodiment, the time slice boundaries 322-329 and/or thresholds may be pre-defined to correspond to offsets (from each frame pulse) at which substantial changes in signal power are anticipated to occur. For example, in a TDD system, it may be known a priori that downlink subframes are to be transmitted by the system within certain ranges of offsets from a frame pulse, and uplink subframes are to be received within other ranges of offsets from the frame pulse. Other ranges of offsets may correspond to guard bands. In such an embodiment, it would be expected that the power of the signal to be transmitted would change significantly at offsets that correspond to transitions between a downlink subframe and an uplink subframe. More specifically, the signal power in each downlink subframe would be significantly higher than the signal power in each uplink subframe. Accordingly, in some embodiments, the time slice boundaries 322-329 may be pre-determined to align with transitions between downlink, uplink, and other types of subframes. For example, time slices 311, 313, 315, 317, and 319 have power levels that are consistent with downlink subframes, and time slices 312, 314, 316, and 318 have power levels that are consistent with uplink subframes, guard bands, or other types of relatively-low power subframes. Accordingly, the time slice boundaries 322-329 are determined to align with the transitions between the various types of subframes. In other embodiments, the time slice boundaries 322-329 may be aligned differently. For example, multiple time slices may be defined within any given subframe, and/or the time slice boundaries may not necessarily align with transitions between various types of subframes (e.g., with transitions between downlink and uplink subframes).

Figure 4:
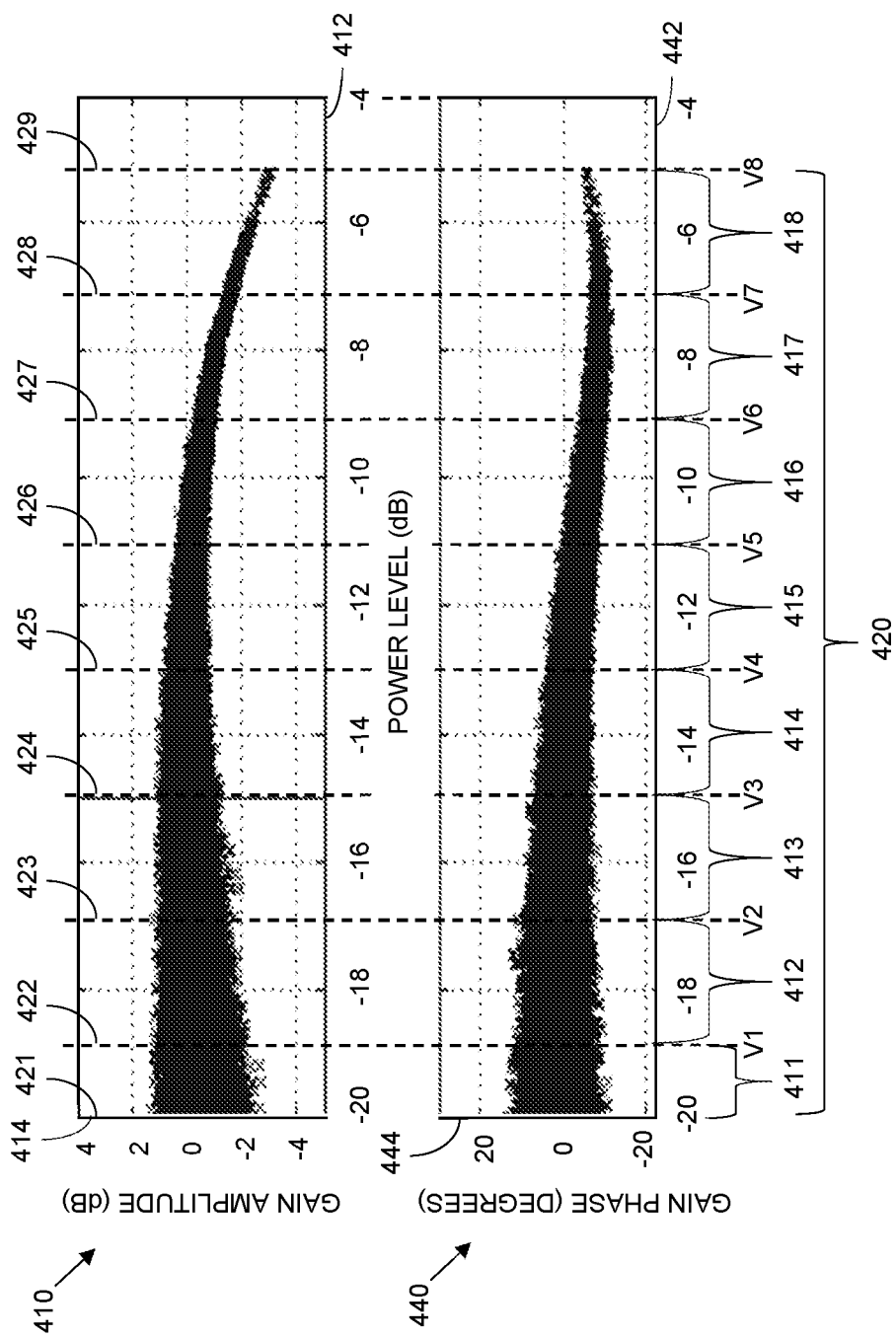
FIG. 4 illustrates, for an example input signal, an AM-AM scatter plot and an AM-PM scatter plot with indications of dynamic range segment boundaries, in accordance with an example embodiment.

To more clearly illustrate the dynamic range-segmentation aspect of the DPD embodiments, FIG. 4 illustrates an AM-AM scatter plot 410 and an AM-PM scatter plot 440 for an example input signal with indications of dynamic range boundaries, in accordance with an example embodiment. More specifically, AM-AM scatter plot 410 is a representation of gain amplitude versus power for an input signal, where the x-axis 412 corresponds to signal power (in dBFS (decibels relative to full scale)), and the y-axis 414 corresponds to gain amplitude (e.g., in dB, and normalized to input level). Conversely, AM-PM scatter plot 440 is a representation of gain phase versus power for an input signal, where the x-axis 442 corresponds to signal power (in dB), and the y-axis 444 corresponds to gain phase (in degrees).

To implement dynamic range segmentation, a total power range of interest 420 is segmented into multiple (e.g., $N_{DR}=8$) dynamic range segments 411, 412, 413, 414, 415, 416, 417, 418. Although the embodiment of FIG. 4 depicts segmentation into 8 dynamic range segments 411-418, a power range may be segmented into more or fewer segments, as well. Each segment boundary 422-429 corresponds to a dynamic range threshold $V_1, V_2, \ldots, V_8$. For example, segment 411 is bounded by segment boundaries 421 and 422. When a signal block has a dynamic range between the low end of the power range 420 (e.g., −20 dB) and threshold V1 (corresponding to boundary 422), the signal block would be associated with dynamic range segment 411. Similarly, when a signal block has a dynamic range between thresholds V7 and V8 (corresponding to boundaries 428 and 429), the signal block would be associated with dynamic range segment 418.

The dynamic range segment boundaries 422-429 may be pre-defined, and/or the dynamic range segment boundaries 422-429 may be revised during operation of the system. According to an embodiment, the dynamic range boundaries 422-429 and/or thresholds may be pre-defined to be evenly distributed across the total power range 420. Alternatively, the dynamic range boundaries 422-429 and/or thresholds may be unevenly allocated across the total power range 420. In addition, more or fewer dynamic range segments 411-418 may be defined.

Referring again to FIG. 2, and as mentioned above, the coefficient selection module 216 receives block power statistics 244 from the block power statistics module 212, and receives a timing signal 248 from the signal timing module 214. The block power statistics 244 and the timing signal 248 may be synchronized so that the coefficient selection module 216 can associate the block power statistics 244 with a sample block that is positioned at a known temporal location within a radio frame. According to an embodiment, for each sample block, the coefficient selection module 216 utilizes the timing signal 248 to determine which time slice the sample block falls within in a radio frame (e.g., which of time slices 311-319, FIG. 3). For example, in making this determination, the coefficient selection module 216 may compare the temporal offset of the sample block with respect to the frame pulse to the time slice thresholds $T_1, T_2, \ldots, T_9$. In addition, the coefficient selection module 216 utilizes the block power statistics 244 to determine the dynamic range of the sample block, and to further determine which dynamic range segment the sample block is associated with (e.g., which of dynamic range segments 411-418, FIG. 4). For example, in making this determination, the coefficient selection module 216 may compare the dynamic range of the sample block to the dynamic range thresholds $V_1, V_2, \ldots, V_8$.

As also mentioned above, potentially different DPD model selections (e.g., sets of predistortion coefficients) may be associated with each combination of time and dynamic range segments. Accordingly, if a radio frame is divided into $N_{TS}$ time slice segments, and a power range of interest is divided into $N_{DR}$ dynamic range segments, there are $N_{TS} \times N_{DR}$ different time slice/dynamic range segment combinations, and there may be $N_{TS} \times N_{DR}$ potentially different DPD model selections. According to an embodiment, potentially different sets of DPD coefficients for each of the $N_{TS} \times N_{DR}$ potentially different time slice/dynamic range segment combinations are stored in a "predistortion coefficient table" (e.g., Table 1, below) within coefficient memory 218.

In an example embodiment of a predistortion coefficient table, such as Table 1, below, each row (or column) may correspond to a time slice segment within the duration of a radio frame, and each column (or row) may correspond to a dynamic range segment within the power range of interest. Accordingly, each cell within the predistortion coefficient table corresponds to a unique combination of a time slice segment and a dynamic range segment. A set of predistortion coefficients, $d_{T,DR}$, is stored within each cell, and the values of the predistortion coefficients within each stored set can be different from each other.

TABLE 1

Predistortion Coefficient Table

| | time slice | | | |
|---|---|---|---|---|
| dynamic range | $0-T_1$ | $T_1-T_2$ | ... | $T_{(NTS-1)}-T_{NTS}$ |
| $V_{MIN}-V_1$ | $d_{1,1}$ | $d_{2,1}$ | | $d_{NTS,1}$ |
| $V_1-V_2$ | $d_{1,2}$ | $d_{2,2}$ | | $d_{NTS,2}$ |
| ... | | | | |
| $V_{(NDR-1)}-V_{NDR}$ | $d_{1,NDR}$ | $d_{2,NDR}$ | | $d_{NTS,NDR}$ |

The number of values in each set of predistortion coefficients may be defined based on the complexity of the power amplifier (e.g., PA 180, FIG. 1), and more specifically based on the complexity of the desired compensation for the non-linearity that the power amplifier applies to the signal being amplified. For example, each set of predistortion coefficients may include from 12 to 60 coefficients, although each set may include more or fewer coefficients, as well. Further, although at least some of the sets of coefficients have different values, some sets may have values that are identical to those for other sets. In other words, all of the coefficient sets are not required to be unique.

As mentioned above, and referring again to FIG. 2, the coefficient selection module 216 determines which time slice a sample block falls within in a radio frame (e.g., which of time slices 311-319, FIG. 3), and determines which dynamic range segment the sample block is associated with (e.g., which of dynamic range segments 411-418, FIG. 4). After making this determination, the coefficient selection module 216 uses the determined time slice segment and the dynamic range segment as keys (or indices) to retrieve the predistortion coefficients for the determined time slice/dynamic range segment combination from the predistortion coefficient table in coefficient memory 218. The coefficient selection module 216 then provides the retrieved set of predistortion coefficients in a signal 252 to the segmented actuator module 222. The processes performed by the block power statistics module 212 and the coefficient selection module 216 are repeated for each sample block, in an embodiment.

The segmented actuator module 222 receives the sets of predistortion coefficients 252 and also receives the input signal 242 in the form of a sequence of sample blocks, as indicated previously. In an embodiment, a buffer and/or a delay element (not illustrated) may be employed to store and/or delay the signal 242 by an amount of time sufficient for the predistortion coefficients 252 to be determined and provided for each sample block within the RF signal 242. In addition, a delayed version of the stored signal 242 may later be accessed during a process of adapting stored predistortion coefficients, as will be described later in conjunction with the description of adaptation module 220.

The segmented actuator module 222 applies each received set of predistortion coefficients 252 to the sample block 242 for which the set of predistortion coefficients 252 was determined, in order to produce a pre-distorted output signal 232 (e.g., output signal 132, FIG. 1) in the form of a sequence of pre-distorted sample blocks (block 506, FIG. 5). In this manner, the segmented actuator module 222 performs a predistortion process in which different sets of predistortion coefficients may be applied to consecutive sample blocks 242 based on the position of each sample block within a radio frame and the dynamic range of each sample block. As discussed above, the predistorted output signal 232 is then converted into an analog signal (e.g., by DAC 165, FIG. 1), upconverted to RF (e.g., by RF mixer 168, FIG. 1), amplified (e.g., by PA 180, FIG. 1), and radiated onto the air interface (e.g., by antenna 104, FIG. 1) (block 508, FIG. 5).

According to an embodiment, the predistortion coefficients in the predistortion coefficient table may be static (e.g., not adapted during operation of the system after convergence of the coefficients). In an alternate embodiment, an adaptive process may be performed to alter the predistortion coefficients during operation (block 510, FIG. 5). This may be particularly beneficial, for example, when the non-linearity exhibited by the PA (e.g., PA 180, FIG. 1) varies over time, temperature, and so on. The predistortion coefficients may be adapted using an indirect learning approach (e.g., in which the predistortion coefficient adaptation is used based on feedback from the power amplifier) or using a direct learning approach (e.g., in which the predistortion coefficients are directly adjusted in the feed-forward path), in various embodiments. For example in one embodiment, to perform the adaptive process, an adaptation module 220 receives a digital feedback signal 254 (e.g., derived from analog feedback signal 154, FIG. 1), which is a digital representation of the previously-processed sample blocks after the non-linearity of the PA has been introduced into the signal. The adaptation module 220 may compare the sample blocks within the digital feedback signal 254 with delayed versions of the sample blocks produced by the CFR module 210 (e.g., sample blocks in signal 242) or produced by the segmented actuator module 222 (e.g., sample blocks in predistorted output signal 232). In either case, the adaptation module 220 performs the comparison with the same time slice segmentation that was applied by the segmented actuator module 222, and various delays may be applied to the signals 232, 242 to ensure that signals 232, 242 are aligned with the feedback signal 254 for the comparison. When the adaptation module 220 determines that the difference is greater than a threshold (or otherwise could be improved), the adaptation module 220 may calculate a new set of predistortion coefficients that is likely to yield improvement. The adaptation module 220 may then update the predistortion coefficients in the appropriate cell of the predistortion coefficient table (in coefficient memory 218), or more particularly the cell from which the coefficient selection module 216 previously retrieved the set of predistortion coefficients that was applied to the sample block during the previously-performed predistortion process. Accordingly, to facilitate adaptive predistortion, the system 200 may store (e.g., in volatile memory, not illustrated) historical information during operation that includes sample blocks and indications of the time slice/dynamic range segments to which each sample block was allocated.

An embodiment of an apparatus includes a digital predistortion circuit, which is configured to receive an input signal that includes a sequence of input sample blocks, and to perform a digital predistortion process on the input signal to produce a predistorted output signal. The digital predistortion process includes selecting a first set of predistortion coefficients for a first input sample block from a plurality of different sets of predistortion coefficients, where each of the plurality of different sets of predistortion coefficients is associated with a different combination of one of a plurality of time slices within a radio frame and one of a plurality of power ranges, and the first set of predistortion coefficients is associated with a time slice within which the first input sample block is positioned and a power range calculated for the first input sample block based on block power statistics of the first sample block. The digital predistortion further includes applying the first set of predistortion coefficients to the first input sample block to produce the predistorted output signal.

An embodiment of a method of performing digital predistortion of a sequence of input sample blocks within a radio frame, includes selecting, by a digital predistortion circuit, a first set of predistortion coefficients for a first input sample block from a plurality of different sets of predistortion coefficients, where each of the plurality of different sets of predistortion coefficients is associated with a different combination of one of a plurality of time slices within a radio frame and one of a plurality of power ranges, and the first set of predistortion coefficients is associated with a time slice within which the first input sample block is positioned and a power range calculated for the first input sample block based on block power statistics of the first sample block. The method further includes applying, by the digital predistortion circuit, the first set of predistortion coefficients to the first input sample block to produce a predistorted output signal.

It should be understood that the order of operations associated with the blocks depicted in FIG. 5 corresponds to an example embodiment, and the depicted order should not be construed to limit the sequence of operations only to the illustrated order. Instead, some operations may be performed in different orders, and/or some operations may be performed in parallel.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An apparatus comprising:
 a memory configured to store a predistortion coefficient table that includes a plurality of different sets of predistortion coefficients, wherein a duration of a radio frame is divided into a plurality of consecutive time slice segments with boundaries that align with transitions between downlink subframes and uplink subframes, wherein a power range of interest is divided into a plurality of dynamic range segments, and wherein each cell within the predistortion coefficient table corresponds to a unique combination of a dynamic range segment of the plurality of dynamic range segments and a time slice segment of the plurality of consecutive time slice segments, and wherein each of the plurality of different sets of predistortion coefficients in the predistortion coefficient table are stored in a different cell in the predistortion coefficient table;
 a digital predistortion circuit configured to receive an input signal that includes a sequence of input sample blocks, and to perform a digital predistortion process on the input signal to produce a predistorted output signal, wherein the digital predistortion process includes
 selecting a first set of predistortion coefficients for a first input sample block from the plurality of different sets of predistortion coefficients stored in the memory, wherein the first set of predistortion coefficients is associated with a time slice within which the first input sample block is positioned and a power range calculated for the first input sample block based on block power statistics of the first input sample block, and
 applying the first set of predistortion coefficients to the first input sample block to produce the predistorted output signal.

2. The apparatus of claim 1, wherein the digital predistortion circuit is further configured to:
 select a second set of predistortion coefficients for a second input sample block from the plurality of different sets of predistortion coefficients, wherein the second set of predistortion coefficients is different from the first set of predistortion coefficients, and the second set of predistortion coefficients is associated with a different combination of a time slice within the radio frame and a power range, and
 apply the second set of predistortion coefficients to the second input sample block to further produce the predistorted output signal.

3. The apparatus of claim 1, further comprising:
 a block power statistics module configured to determine the block power statistics for the first input sample block.

4. The apparatus of claim 3, wherein the block power statistics are selected from a peak power value, an average power value, a dynamic range value, a root mean squared value, and a crest factor.

5. The apparatus of claim 1, further comprising:
 an adaptation module, coupled to the memory, and configured to calculate new sets of predistortion coefficients based on a digital feedback signal corresponding to the first sample block, and to overwrite the first set of predistortion coefficients in the predistortion coefficient table.

6. The apparatus of claim 1, further comprising:
 a signal timing module, coupled to the digital predistortion circuit, and configured to produce a timing signal to indicate a temporal location of the first sample block within the radio frame.

7. The apparatus of claim 1, further comprising:
 a radio frequency (RF) conversion circuit, coupled to the digital predistortion circuit, and configured to perform a digital-to-analog conversion and upconversion of the predistorted output signal to generate an analog RF signal; and
 a power amplifier coupled to the RF conversion circuit, and configured to amplify the analog RF signal to produce an amplified RF signal.

8. The apparatus of claim 1, wherein the sequence of input sample blocks includes a sequence of samples of time-domain representations of a portion of a composite signal that comprises one or more carriers multiplexed in within a transmission frequency band, wherein each carrier belongs to a specific radio access technology (RAT).

9. The apparatus of claim 8, wherein each carrier belongs to a specific RAT selected from Long Term Evolution (LTE) with differing bandwidths, Wideband Code Division Multiple Access (WCDMA), and Global System for Mobile communication (GSM).

10. The apparatus of claim 1, wherein the digital predistortion circuit is implemented using a vector signal processor.

11. A method of performing digital predistortion of a sequence of input sample blocks within a radio frame, the method comprising:
 storing a predistortion coefficient table that includes a plurality of different sets of predistortion coefficients in a memory, wherein a duration of a radio frame is divided into a plurality of consecutive time slice segments with boundaries that align with transitions between downlink subframes and uplink subframes, wherein a power range of interest is divided into a plurality of dynamic range segments, and wherein each cell within the predistortion coefficient table corresponds to a unique combination of a dynamic range segment of the plurality of dynamic range segments and a time slice segment of the plurality of consecutive time slice segments, and wherein each of the plurality of different sets of predistortion coefficients in the predistortion coefficient table are stored in a different cell in the predistortion coefficient table;
 selecting, by a digital predistortion circuit, a first set of predistortion coefficients for a first input sample block from the plurality of different sets of predistortion coefficients, wherein the first set of predistortion coefficients is associated with a time slice within which the first input sample block is positioned and a power range calculated for the first input sample block based on block power statistics of the first input sample block; and applying, by the digital predistortion circuit, the first set of predistortion coefficients to the first input sample block to produce a predistorted output signal.

12. The method of claim 11, further comprising:

selecting, by the digital predistortion circuit, a second set of predistortion coefficients for a second input sample block from the plurality of different sets of predistortion coefficients, wherein the second set of predistortion coefficients is different from the first set of predistortion coefficients, and the second set of predistortion coefficients is associated with a different combination of a time slice within the radio frame and a power range, and applying the second set of predistortion coefficients to the second input sample block to further produce the predistorted output signal.

13. The method of claim 11, further comprising:

determining the block power statistics for the first input sample block.

14. The method of claim 13, wherein the block power statistics are selected from a peak power value, an average power value, a dynamic range value, a root mean squared value, and a crest factor.

15. The method of claim 11, further comprising:

calculating, by an adaptation module, new sets of predistortion coefficients based on a digital feedback signal corresponding to the first sample block; and overwriting, by the adaptation module, the first set of predistortion coefficients in the predistortion coefficient table.

16. The method of claim 11, further comprising:

producing, by a signal timing module, a timing signal to indicate a temporal location of the first input sample block within the radio frame.

17. The method of claim 11, further comprising:

performing, by a crest factor reduction module, a crest factor reduction process on the first input sample block prior to applying the first set of predistortion coefficients.

18. The method of claim 11, further comprising:

performing, by a radio frequency (RF) conversion circuit, a digital-to-analog conversion and upconversion of the predistorted output signal to generate an analog RF signal; and amplifying, by a power amplifier, the analog RF signal to produce an amplified RF signal.

19. The method of claim 11, wherein the sequence of input sample blocks includes a sequence of samples of time-domain representations of a portion of a composite signal that comprises one or more carriers multiplexed in within a transmission frequency band, wherein each carrier belongs to a specific radio access technology (RAT).

* * * * *